(12) United States Patent
Adamec et al.

(10) Patent No.: US 6,943,349 B2  
(45) Date of Patent: Sep. 13, 2005

(54) MULTI BEAM CHARGED PARTICLE DEVICE

(75) Inventors: Pavel Adamec, Hoar (DE); Ralf Degenhardt, Landshem (DE); Hans-Peter Feuerbaum, Munich (DE); Harry Munack, Pfullingen (DE); Dieter Winkler, München (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 327 days.

(21) Appl. No.: 10/258,869

(22) PCT Filed: Apr. 27, 2001

(86) PCT No.: PCT/EP01/04787

§ 371 (c)(1),  
(2), (4) Date: May 12, 2003

(87) PCT Pub. No.: WO01/84592

PCT Pub. Date: Nov. 8, 2001

(65) Prior Publication Data

US 2003/0168606 A1 Sep. 11, 2003

(30) Foreign Application Priority Data

Apr. 27, 2000 (EP) ............................................. 00108973

(51) Int. Cl.[7] .......................... G21K 1/08; G01N 23/00; H01J 37/28; H01J 3/14
(52) U.S. Cl. ...................... 250/310; 250/306; 250/307; 250/309; 250/311; 250/397; 250/398; 250/399; 250/492.1; 250/492.2; 250/492.21; 250/492.22; 250/492.3; 250/396 R

(58) Field of Search ............................. 250/492.1, 492.2, 250/492.21, 492.22, 492.3, 396 R, 397–399, 306–307, 309–311

(56) References Cited

U.S. PATENT DOCUMENTS 3,491,236 A * 1/1970 Newberry .................... 250/307  
3,857,034 A * 12/1974 Hoppe ......................... 250/311

(Continued)

FOREIGN PATENT DOCUMENTS

| EP | 0 087 196 A | 8/1983 |
| EP | 0 213 664 A | 3/1987 |
| FR | 2 488 043 A | 2/1982 |

*Primary Examiner*—John R. Lee  
*Assistant Examiner*—Bernard Souw  
(74) *Attorney, Agent, or Firm*—Sughrue Mion, PLLC

(57) ABSTRACT

The present invention provides an improved column for a charged particle beam device. The column comprises an aperture plate having multiple apertures to produce multiple beams of charged particles and a deflector to influence the beams of charged particles so that each beam appears to come from a different source. Furthermore, an objective lens is used in order to focus the charged-particle beams onto the specimen. Due to the deflector, multiple images of the source are created on the surface of the specimen whereby all the images can be used for parallel data acquisition. Accordingly, the speed of data acquisition is increased. With regard to the focusing properties of the objective lens, the beams of charged particles can basically be treated as independent particle beams which do not negatively affect each other. Accordingly, each beam basically provides the same resolution as the beam of a conventional charged particle beam device.

28 Claims, 13 Drawing Sheets

U.S. PATENT DOCUMENTS

| | | | | |
|---|---|---|---|---|
| 4,130,761 A | * | 12/1978 | Matsuda | 250/492.2 |
| 4,694,178 A | * | 9/1987 | Harte | 250/396 R |
| 4,859,856 A | * | 8/1989 | Groves et al. | 250/398 |
| 5,099,130 A | * | 3/1992 | Aitken | 250/396 R |
| 5,747,801 A | * | 5/1998 | Quarmby et al. | 250/292 |
| 5,892,224 A | * | 4/1999 | Nakasuji | 250/310 |
| 6,124,592 A | * | 9/2000 | Spangler | 250/287 |
| 6,252,412 B1 | * | 6/2001 | Talbot et al. | 324/750 |
| 6,465,783 B1 | * | 10/2002 | Nakasuji | 250/311 |
| 6,545,274 B1 | * | 4/2003 | Morita | 250/307 |
| 6,576,893 B1 | * | 6/2003 | Kawato et al. | 250/281 |
| 6,586,746 B1 | * | 7/2003 | Messick et al. | 250/396 R |
| 6,614,026 B1 | * | 9/2003 | Adamec | 250/398 |
| 6,617,587 B2 | * | 9/2003 | Parker et al. | 250/398 |
| 2002/0130262 A1 | * | 9/2002 | Nakasuji et al. | 250/311 |
| 2002/0166964 A1 | * | 11/2002 | Talbot et al. | 250/307 |
| 2003/0085360 A1 | * | 5/2003 | Parker et al. | 250/396 R |
| 2003/0168606 A1 | * | 9/2003 | Adamec et al. | 250/396 R |

* cited by examiner

MULTI BEAM CHARGED PARTICLE DEVICE

This is a National stage entry under 35 U.S.C. § 371 of Application No. PCT/EP01/04787 filed Apr. 27, 2001; the disclosure of which is incorporated herein by reference.

FIELD OF THE INVENTION

The invention relates to an apparatus for the examination of specimen with charged particles. In particular, this invention relates to an apparatus for the examination of specimen with multiple beams of charged particles.

BACKGROUND OF THE INVENTION

Modern semiconductor technology is highly dependent on an accurate control of the various processes used during the production of integrated circuits. Accordingly, the wafers have to be inspected repeatedly in order to localize problems as early as possible. Furthermore, a mask or reticle should also be inspected before its actual use during wafer processing in order to make sure that the mask accurately defines the desired pattern. This is done because any defects in the mask pattern will be transferred to the substrate (e.g., wafer) during its use in microlithography. However, the inspection of wafers or masks for defects requires the examination of the whole wafer or mask area. Especially, the inspection of wafers during their fabrication requires the examination of the whole wafer area in such a short time that production throughput is not limited by the inspection process.

Scanning electron microscopes (SEM) have been used to inspect wafers to detect pattern defects. Thereby, the surface of the wafer is scanned using a single finely drawn electron beam. When the electron beam hits the wafer, secondary electrons are generated and measured. A pattern defect at a location on the wafer is detected by comparing an intensity signal of the secondary electrons to, for example, a reference signal corresponding to the same location on the pattern. However, because only one very narrow electron beam is used for scanning, a long time is required to scan the entire surface of the wafer. Accordingly, it is not feasible to use a conventional (single-beam) Scanning Electron Microscope (SEM) for wafer inspection, since this approach does not provide the required throughput. Therefore, high speed wafer inspection is presently carried out by means of light optical techniques.

In order to perform this task using electron microscopic techniques several approaches have been suggested. One approach is based on the miniaturization of SEMs, so that several miniaturized SEMs (in the order of ten to one hundred) are arranged in an array and each miniaturized SEM examines a small portion of the complete sample surface. Another approach makes use of fixed-beam surface electron microscopes which image a certain area of the sample simultaneously. These surface microscopes can be classified by the excitation process of the electrons that form the image at the detector: a) The Photoemission Electron Microscope (PEEM), where the electrons are created by illumination of the sample surface with UV light, synchrotron radiation, or X-rays and b) the so-called Low-energy Electron Microscope (LEEM), where, in various modes of operation, the sample surface is illuminated with electrons. In this case, the illuminating electrons have to be separated from the imaging electrons by means of an additional electron optical element, for example, a beam separator in the form of a dipole magnet. However, both approaches have not yet been put into industrial practice.

Multi-beam electron projection systems are used to create patterns of variable shape on a substrate by switching on and off individual beams as is described in document EP 0 508 151. The following remarks are particularly relevant: First, as a projection system, it inherently does not produce an image of a sample and, therefore, does not comprise an objective lens. Secondly, in the example to which we referred to above, a resulting electron beam, formed by the individual beams that are not blanked out, is scanned as a whole over the substrate.

Furthermore, SEMs using multiple charged particle beams have been suggested in order to increase the throughput of data collection process. For example, U.S. Pat. No. 5,892,224 describes an apparatus for inspecting masks and wafers used in microlithography. The apparatus according to U.S. Pat. No. 5,892,224 is adapted to irradiate multiple charged particle beams simultaneously on respective measurement points on the surface of a sample. However, the apparatus according to U.S. Pat. No. 5,892,224 is primarily designed for the inspection of masks and does not provide the resolution which is required to inspect the intricate features present on a semiconductor wafer.

In charged particle beam devices, such as a scanning electron microscope (SEM), the charged particle beam exhibits a typical aperture angle as well as a typical angle of incidence in the order of several millirads. However, for many applications, it is desirable that the charged particle beam hits the sample surface under a much larger angle of typically 5° to 10°, corresponding to 90 to 180 millirads. Stereoscopic visualization is an example of such an application. Some applications even require tilt angles in excess of 15° or even 20°. In many cases, the additional information which is contained in stereo images is extremely valuable in order to control the quality of a production process.

Thereby, a number of tilting mechanism can be used. In early solutions, an oblique angle of incidence was achieved by mechanically tilting the specimen. However, apart from other drawbacks, mechanically tilting the specimen takes a lot of time. An oblique angle of incidence may also be achieved by electrically tilting the charged particle beam. This can be done by deflecting the beam so that either by the deflection alone or in combination with the focussing of the beam, an oblique angle of incidence results. Thereby, the specimen can remain horizontal which is a significant advantage as far as the lateral coordinate registration is concerned. Furthermore, electrical tilting is also much faster than its mechanical counterpart. However, even though electrical tilting is in principal faster than its mechanical counterpart, additional alignment procedures are usually required when the beam is shifted electrically from angle of incidence to another angle of incidence. These additional alignment also require a considerable amount time. Therefore, stereoscopic visualization is not routinely done in the semiconductor industry.

Accordingly, there is a need for a charged particle beam device which provides a sufficient resolution and which is able to increase the data collection to such an extent that the device can also be applied to high speed wafer inspection. Furthermore, there is a need for a charged particle beam device which is able to reduce the time that is needed to produce a pair of stereo images.

SUMMARY OF THE INVENTION

The present invention provides an improved column for a charged particle beam device. According to one aspect of the present invention, there is provided a column for a charged particle beam device as specified in independent claim 1. According to a further aspect of the present invention there is provided a column for a charged particle beam device as specified in independent claim 9. Further advantageous features, aspects and details of the invention are evident from the dependent claims, the description and the accompanying drawings. The claims are intended to be understood as a first non-limiting approach of defining the invention in general terms.

The present invention provides an improved column for a charged particle beam device. The column comprises an aperture plate having multiple apertures to produce multiple beams of charged particles and a deflector to influence the beams of charged particles so that each beam appears to come from a different source. Furthermore, an objective lens is used in order to focus the charged-particle beams onto the specimen. Due to the deflector, multiple images of the source are created on the surface of the specimen whereby all the images can be used for parallel data acquisition and/or for parallel modification of the specimen. Accordingly, the speed of data acquisition (modification) is increased. With regard to the focusing properties of the objective lens, the beams of charged particles can basically be treated as independent particle beams which do not negatively affect each other. Accordingly, each beam basically provides the same resolution as the beam a conventional charged particle beam device.

According to a further aspect of the present invention, an improved column for a charged particle beam device is provided which is capable of producing a stereoscopic image of the surface of specimen in a single scan over the surface of specimen. The column comprises an aperture plate having multiple apertures to produce multiple beams of charged particles and a deflector to influence the beams of charged particles so that each beam appears to come from a different source and that each beam passes through the objective lens along an off-axis path. Due to the off-axis path through the objective lens, the charged particle beams are tilted and hit the specimen under oblique angle of incidences. Furthermore, each beam is tilted into a different direction so that the images of two of the beams are sufficient to produce a stereoscopic image of the surface of specimen. Since there no need for any additional alignments of beams with regard to the column, the time that is required to produce a stereoscopic image is reduced considerably.

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Figure 1:
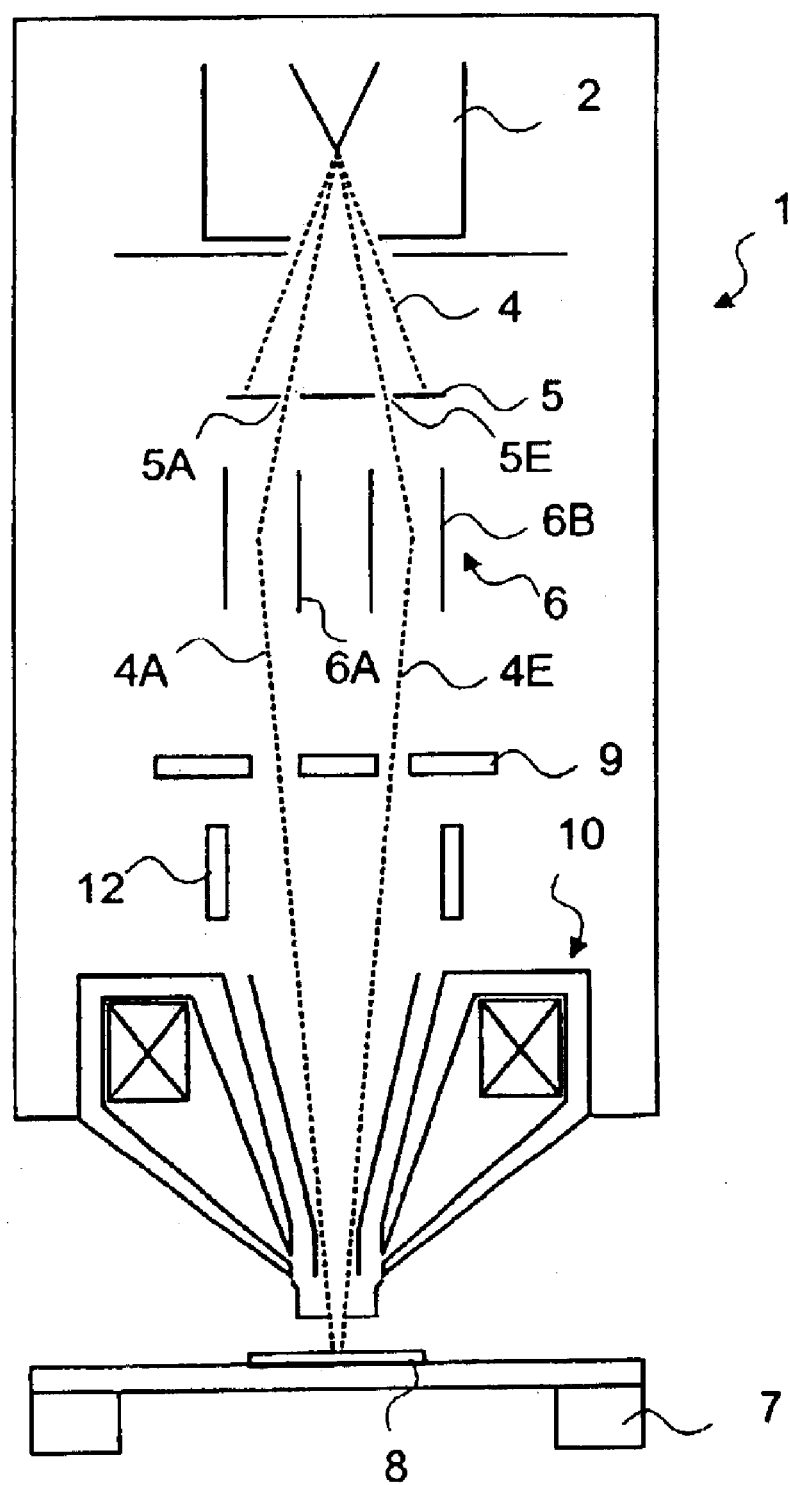
FIG. 1 shows schematically a column according to a first embodiment according to the present invention.

An embodiment according to the invention is shown schematically in FIG. 1. The column 1 for a charged particle beam device comprises a charged particle source 2 which emits a beam 4 of charged particles. In electron beam devices, electron sources such as Tungsten-Hairpin guns, Lanthanum-Hexaboride Guns, Field emission guns etc. can be used. The invention, however, is not limited to electron sources; it can be used together with all kinds of charged particle sources. The charged particles are accelerated by an accelerating voltage supplied to the charged particle source 2.

After leaving the charged particle source 2, the charged particle beam 4 passes through an aperture plate 5 having multiple apertures 5A–5H which are situated along a ring on the aperture plate 5. By passing through the aperture plate 5, multiple charged particle beams 4A–4H are created. Thereafter, a deflector 6 is used to influence the beams of charged particles 4A–4H so that each beam 4A–4H appears to come from a different source. In the present embodiment the deflector 6 has the form of a cylinder lens comprising two cylinder electrodes 6A and 6B which are set to appropriate potentials. For example, the potential difference between the inner cylinder electrode 6A and the outer cylinder electrode 6B is set to +300 Volts so that the beams of charged particles 4A–4H are attracted towards the inner cylinder electrode 6A.

The charged particle beams 4A–4H then pass the detector 9 which is used to detect those particles that come from the specimen 8 in order to produce multiple images of the specimen 8. The detector 9 is divided in multiple segments 9A–9H corresponding to the multiple beams of charged particles 4A–4H. Thereby, each segment 9A–9H of the detector is capable of detecting particles that come from the specimen 8 independent of all the other segments of the detector 9. Furthermore, the detector 9 comprises multiple openings to let the beams of charged particles 4A–4H pass through.

The detector 9 is followed by the scanning coils 12 which are used to move the charged particle beams 4A–4H in a raster over the surface of the specimen 8. After the scanning coils 12, the charged particle beams 4A–4H enter the objective lens 10 that focuses the charged particle beams 4A–4H onto the specimen 8. The objective lens 10 not only focuses the charged particle beams 4A–4H but also rotates the charged particle beams 4A–4H. However, this effect is not shown because it is difficult to depict in a two-dimensional drawing and because the skilled person is well aware of this additional effect. Due to the combined effects of the deflector 6 and the objective lens 10, multiple spots (images of the particle source 2), each corresponding to one of the charged particle beams 4A–4H, are created on the specimen 8. Without the deflector 6, the objective lens 10 would focus the charged particle beams 4A–4H into a single spot on the specimen 8.

When the particles of beams 4A–4H strike the surface of the specimen 8, they undergo a series of complex interactions with the nuclei and electrons of the atoms of the specimen. The interactions produce a variety of secondary products, such as electrons of different energy, X rays, heat, and light. Many of these secondary products are used to produce the images of the sample and to collect additional data from it. A secondary product of major importance to examination or the image formation of specimens are secondary electrons that escape from the specimen 8 at a variety of angles with relatively low energy (3 to 50 eV). The secondary electrons are drawn through the objective lens 10, reach the detector 9, and are then measured. Thereby, the parameters of the objective lens 10 are chosen in such a manner that the secondary electrons and/or backscattered particles that come from specimen are focused onto the detector 9. Accordingly, each spot on the specimen leads to a corresponding spot on the detector. Thereby, the segments 9A–9H of the detector 9 are selected so that each spot basically hits the corresponding segment 9A–9H in its center.

By scanning the charged particle beams 4A–4H over the specimen and displaying/recording the output of the detector 9, multiple independent images of the surface of the specimen 8 are formed. Each image contains information about a different portion of the surface of the specimen. Accordingly, the speed of the data acquisition is increased by a factor 8 with regard to the conventional single beam case. The specimen 8 is supported on a stage 7 (specimen support) which is moveable horizontally in all directions, in order to allow the charged particle beams 4A–4H to reach the target areas on the specimen which are to be examined.

In order to improve the performance of the system, the embodiment shown in FIG. 1 contains an objective lens 10 which is a combination of a magnetic lens 10A and an electrostatic lens 10B. Accordingly, the objective lens 10 is a compound magnetic-electrostatic lens. Preferably, the electrostatic part of the compound magnetic-electrostatic lens 10 is an electrostatic retarding lens 10B. Using such a compound magnetic-electrostatic lens 10 yields superior resolution at low acceleration energies, such as a few hundred electron volts in the case of a SEM. Such low acceleration energies are desirable, especially in modem semiconductor industry, to avoid charging and/or damaging of radiation sensitive specimens. However, the benefits of the present invention are also achieved if only a magnetic lens or only an electrostatic lens is used.

Figure 2:
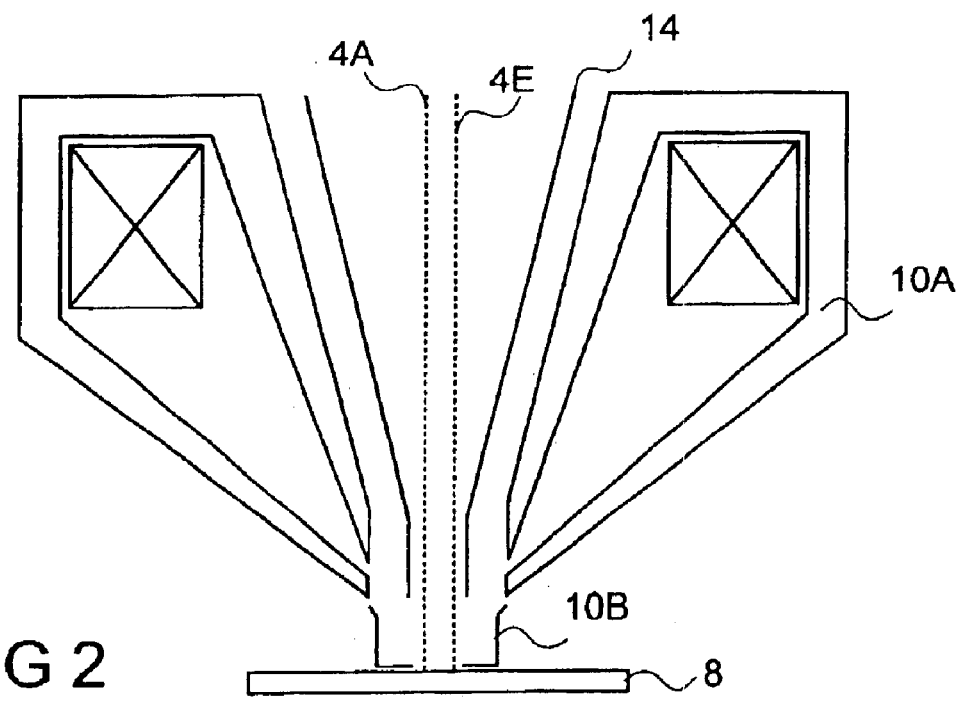
FIG. 2 is an enlarged view showing the objective lens of the embodiment of FIG. 1.
Figure 3:
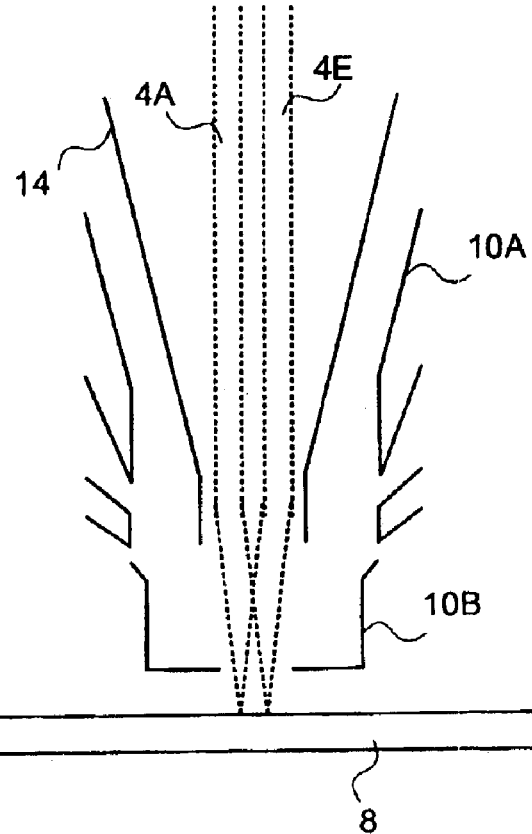
FIG. 3 is an enlarged view of FIG. 2.

FIGS. 2 and 3 show enlarged views on the compound magnetic-electrostatic lens 10 and the specimen 8 as shown in FIG. 1. To achieve a small focal length, the magnetic flux generated by a current through an excitation coil is conducted through pole pieces and is concentrated into a small region along the optical axis of the magnetic lens. The magnetic field is rotationally symmetric around the optical axis and reaches its maximum value in the pole gap between the upper and the lower pole piece. In addition to the magnetic lens 10A, the embodiment shown in FIGS. 1 to 3 contains an electrostatic retarding lens which is situated close to magnetic lens 10A. The electrostatic retarding lens 10B has two electrodes held at different potentials. In the illustrated embodiment, one of the two electrodes is formed by a cylindrical beam tube 14 which is arranged within the magnetic lens 10A along the optical axis The second electrode of the electrostatic retarding lens 10B is a metallic cup provided below the magnetic lens 10A. In operation of the system, the first electrode is usually held at high positive potential, for example 8 kV, where as the second electrode is held at lower positive potential, for example 3 kV, so that the electrons are decelerated in the corresponding electrostatic field from a first energy to a lower second energy.

In the example shown in FIGS. 2 and 3, the specimen 8 is held at ground potential. Accordingly, there is a further electrostatic retarding field between the metallic cup and the specimen 8. However, the surface of the specimen need not be grounded. The electric potential on the surface of the specimen may also be adjusted by applying a voltage to the specimen. A voltage can be applied to a wafer, for example, in order to obtain voltage contrast imaging which is used to detect shorts in a circuit. As long as the potential of the metallic cup is higher than the potential on the surface of the specimen, an electrostatic retarding field is produced. Furthermore, as long as the potential of the metallic cup is higher than the potential on the surface of the specimen, the secondary electrons (backscattered particles) are drawn into the objective lens 10 and reach the detector 9.

Figure 4:
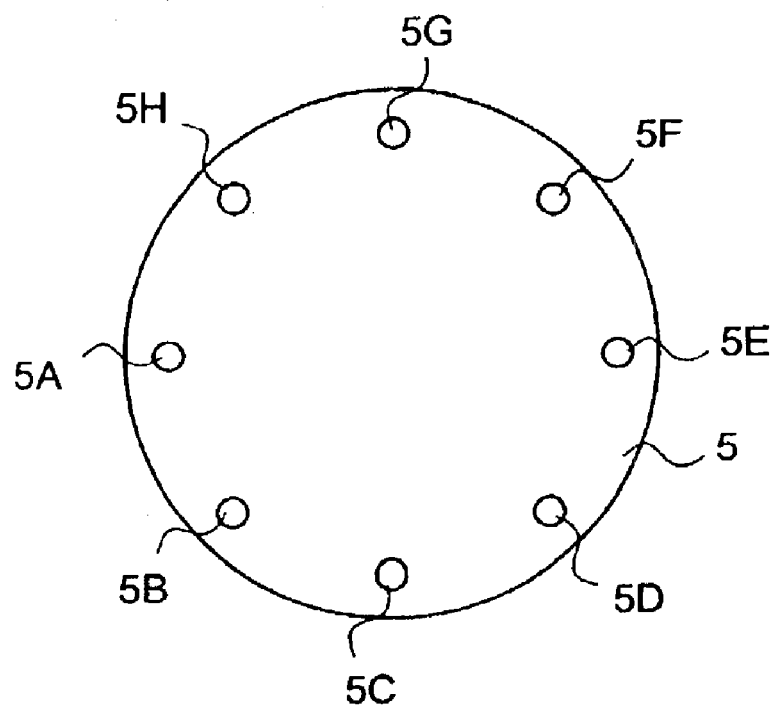
FIG. 4 shows schematically the aperture plate as used in the column shown in FIG. 1.

FIG. 4 shows schematically a top view on the aperture plate 5 as used in the column shown in FIG. 1. The aperture plate S comprises eight apertures 5A–5H which are situated along a ring parallel to the edge of the aperture plate 5. The aperture plate 5 is made of conducting material in order to avoid any charging effects. The size of the apertures 5A–5H is selected so that a predetermined current can be provided.

Figure 5:
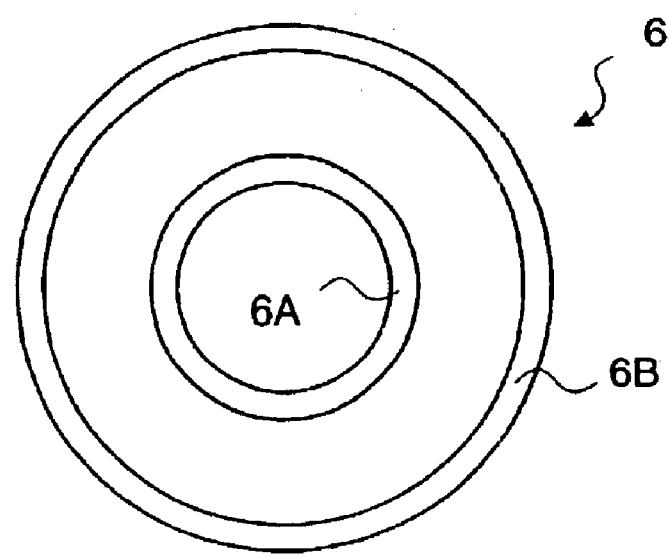
FIG. 5 shows schematically a top view on the cylinder lens as used in the column shown in FIG. 1.

FIG. 5 shows schematically a top view on the deflector 6 as used in the column shown in FIG. 1. The deflector 6 has the form of a cylinder lens comprising two cylinder electrodes 6A and 6B which are set to appropriate potentials. In order to attract the charged particle beams 4A–4H towards the inner cylinder electrode 6A, a potential difference between the inner cylinder electrode 6A and the outer cylinder electrode 6B is provided. The appropriate potential difference between the inner cylinder electrode 6A and the outer cylinder electrode 6B depends on a number of different parameters, for example the energy of the charged particles inside the deflector 6 or the desired distance between two adjacent beams on the surface of the specimen. Usually, the potential difference lies in the range of 100 to 500 Volts.

Figure 6:
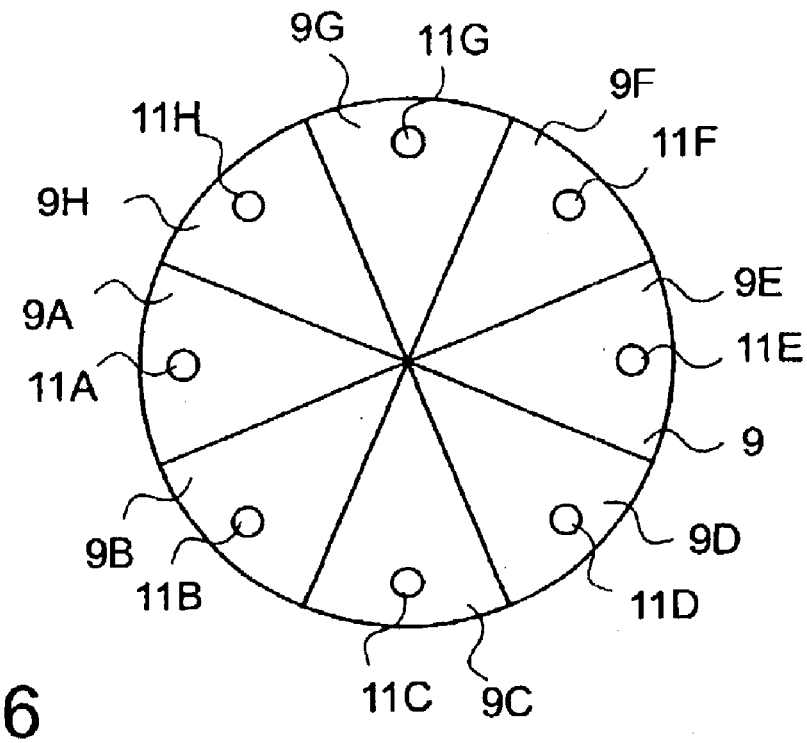
FIG. 6 shows schematically a bottom view on the detector as used in the column shown in FIG. 1.

FIG. 6 shows schematically a bottom view on the detector 9 as used in the column shown in FIG. 1. The detector 9 is divided in multiple segments 9A–9H each having the form of a piece of cake and each corresponding to one of charged particle beams 4A–4H. Thereby, each segment 9A–9H of the detector is capable of detecting particles that come from the specimen 8 independent of all the other segments of the detector 9. Furthermore, detector 9 comprises multiple openings 11A–11H to let the beams of charged particles 4A–4H pass through. The detector 9 is orientated in such a manner so that each spot on the specimen is focused to the center of the corresponding segment 9A–9H.

Figure 7:
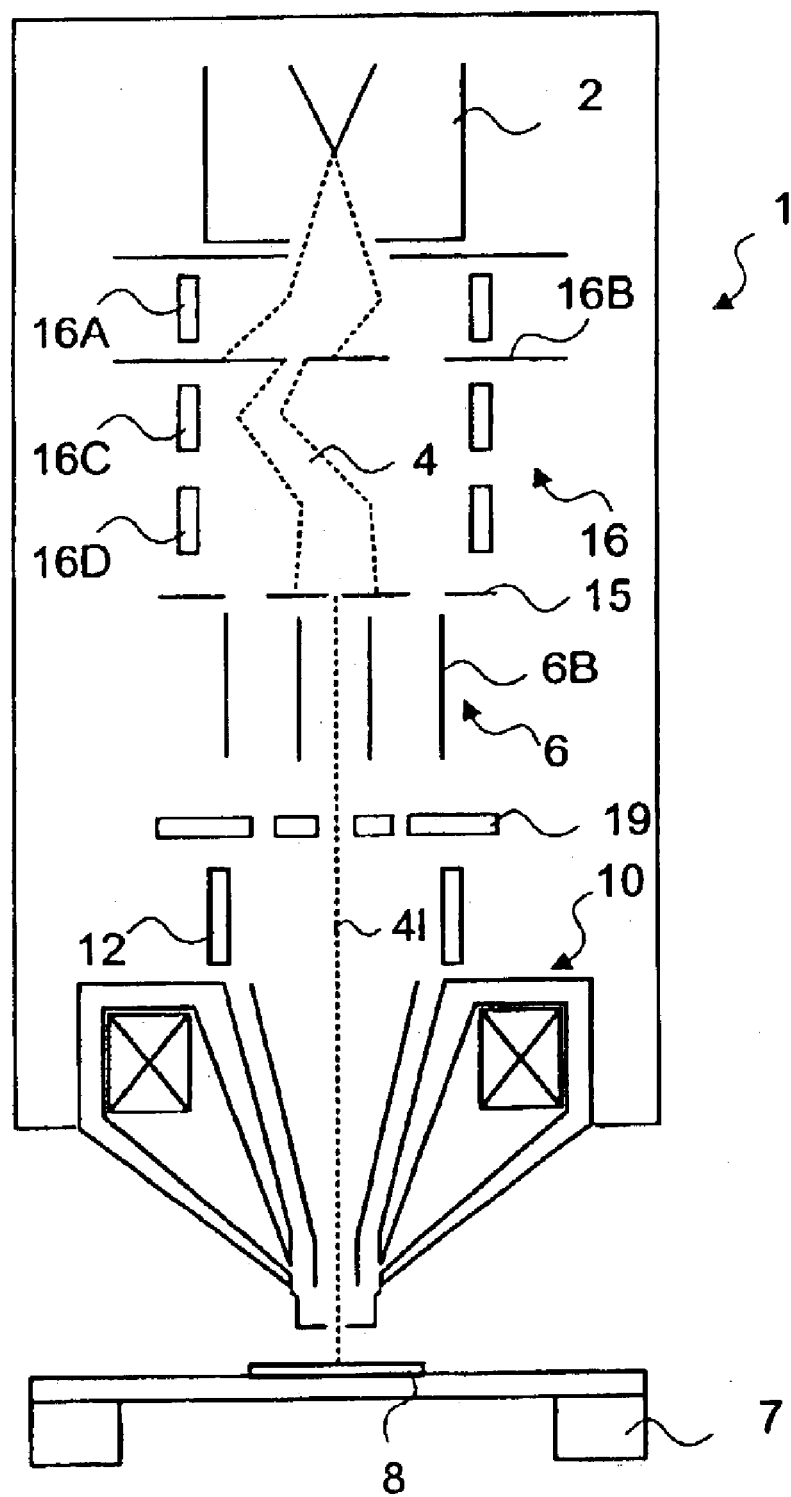
FIG. 7 shows schematically an column according to a second embodiment according to the present invention

FIG. 7 shows schematically a column according to a second embodiment of the present invention. This embodiment is similar to that of FIG. 1, except for the following; The column comprises a beam selector 16 located right after the particle source 2. The beam selector 16 comprises a first deflector 16A, aperture plate 16B, a second deflector 16C, and a third deflector 16D. The aperture plate 16B comprises two apertures having two different diameters. After the beam of charged particles leaves the particle source 2, the first deflector 16A deflects the charged particle beam 4 towards one the two aperture in the aperture plate I&B. Thereafter, the second and the third deflector bring the charged particle beam 4 back to its way along the optical axis of the column.

Figure 9:
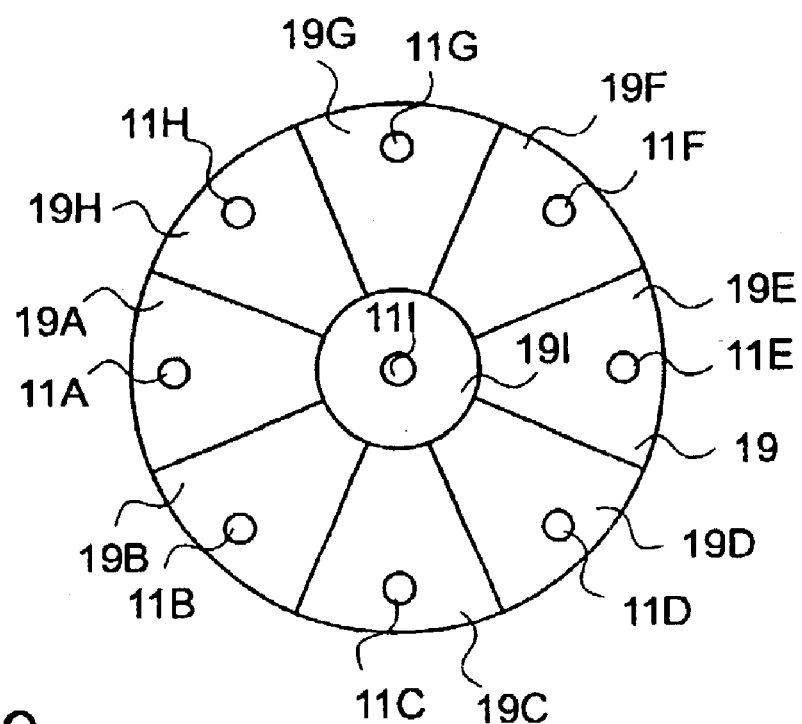
FIG. 9 shows schematically a bottom view on the detector used in the column shown in FIG. 7.
Figure 8:
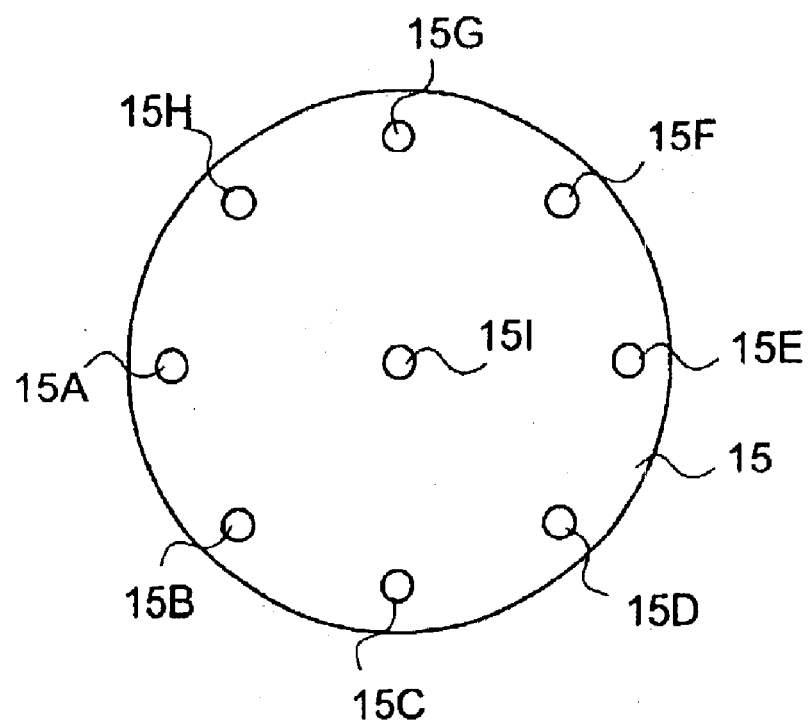
FIG. 8 shows schematically the aperture plate as used in the column shown in FIG. 7.
Figure 11:
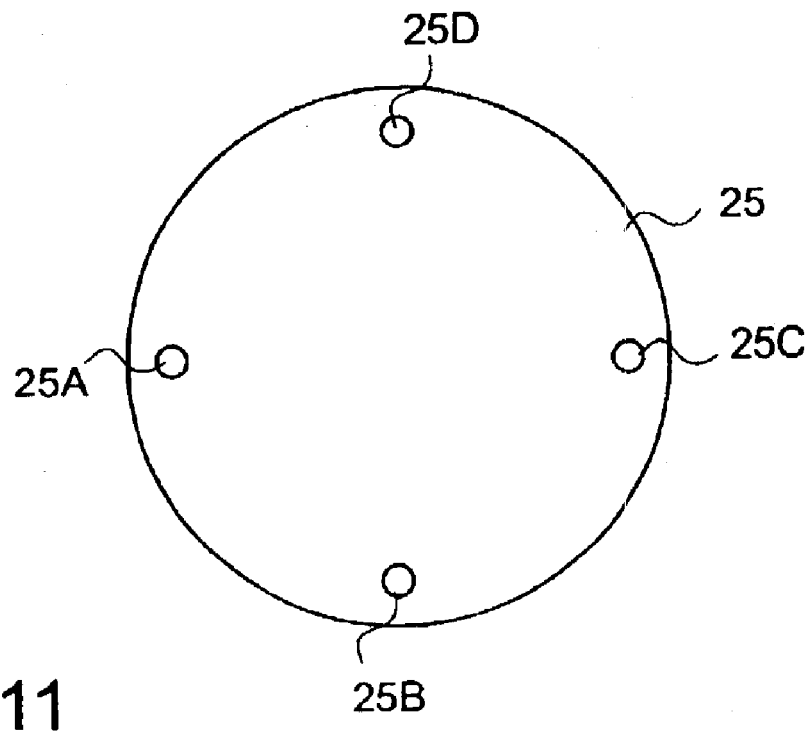
FIG. 11 shows schematically the aperture plate as used in the column shown in FIG. 10.

The aperture plate 15 used in FIG. 7 comprises, in addition to the apertures 15A–15H situated along a ring parallel to the edge of the aperture plate, a further aperture 15I situated in the center of the aperture plate (see FIG. 8). Accordingly, a further beam of charged particles 4I is produced along the optical axis of the column. The detector 19 also contains an additional opening 11I in order to let the beam 4I of charged particles pass through the detector 19 (see FIG. 9).

If the charged particle beam is directed to the smaller aperture in the aperture plate 16B, the resulting beam 4 will be so small that the apertures 15A–15H situated along the ring parallel to the edge of the aperture plate are not illuminated by charged particle beam 4. Accordingly, only charged particle beam 4I is formed. In the following, the charged particle beam 4I passes through the center of the inner electrode 6A without being affected by the field of the cylinder lens 6. Furthermore, the charged particle beam 4I passes through the detector 19 and is focused onto the specimen. Since there are no further charged particle beams, the column basically functions as a conventional single beam device.

If the charged particle beam is directed to the larger aperture in the aperture plate 16B, the resulting beam 4 will be large enough so that the apertures 15A–15H situated along the ring parallel to the edge of the aperture plate are illuminated by charged particle beam 4. Accordingly, all charged particle beams 4A–4I are formed. In this mode, the column shown in FIG. 7 basically operates as the column shown in FIG. 1. Since, in this mode, the parameters of the objective lens 10 are chosen in such a manner that the secondary electrons and/or backscattered particles that come from specimen are focused onto the detector 19, the secondary electrons corresponding to the center beam 4I are focused on the center of the detector 19. Accordingly, these electrons are not measured by the detector 19.

Due to the usage of the beam selector 16, the operator may switch easily between two modes of operation. Accordingly, the device shown in FIG. 7 can be adapted in a fast and efficient manner to the specific measurement needs.

Figure 10:
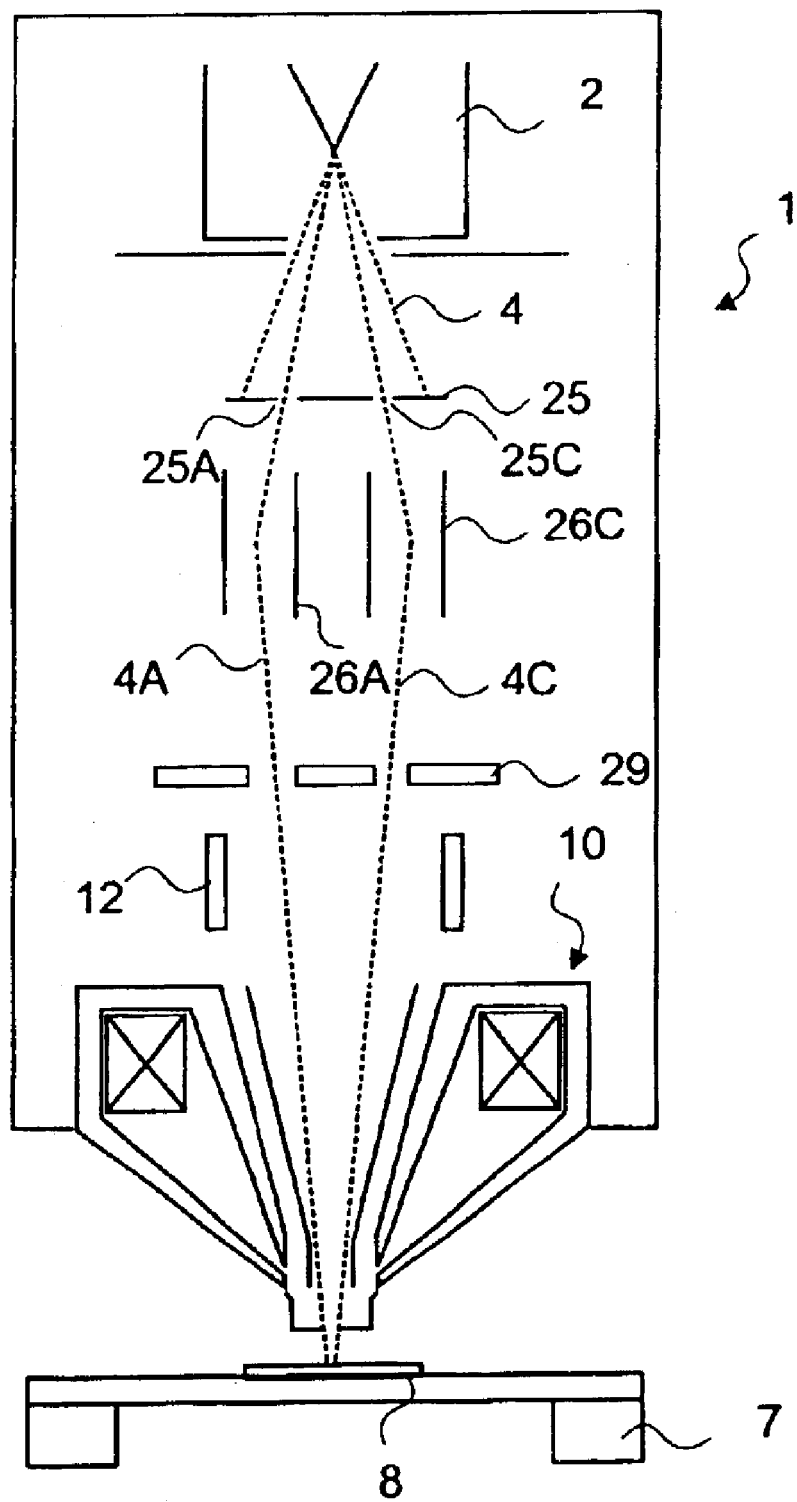
FIG. 10 shows schematically a column according to a third embodiment according to the present invention.

FIG. 10 shows schematically a column according to a third embodiment of the present invention. This embodiment is also similar to that of FIG. 1, except for the following; After leaving the charged particle source 2, the charged particle beam 4 passes through the aperture plate 25 having four apertures 25A–25D which are situated at equal distance along a ring on the aperture plate 25. By passing through the aperture plate 25, four charged particle beams 4A–4D are created. Thereafter, the deflectors 26A–26D are used to influence the beams of charged particles 4A–4D so that each beam 4A–4D appears to come from a different source. The deflectors 26A–26D influence each of the beams 4A–4D individually which leads to a better control of the properties of each individual beam.

Figure 13:
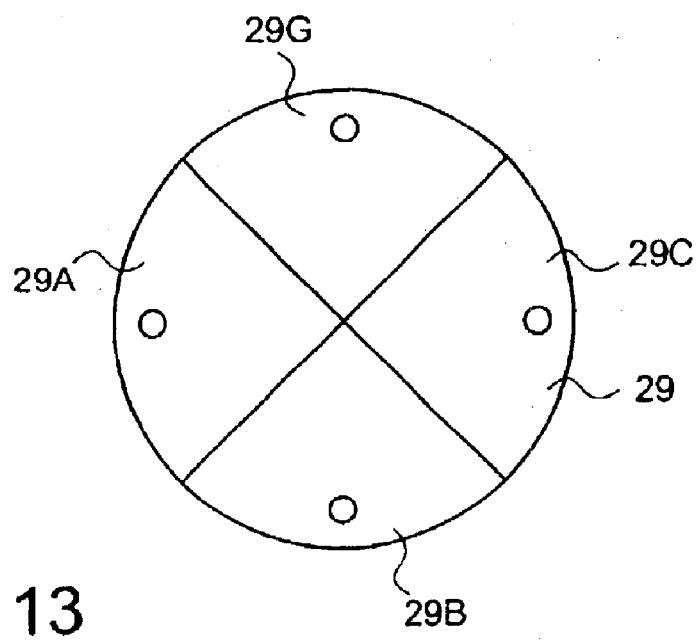
FIG. 13 shows schematically a bottom view on the detector as used in the column shown in FIG. 10.

The charged particle beams 4A–4D then pass the detector 29 which is used to detect those particles that come from the specimen 8 in order to produce multiple images of the specimen 8. The detector 29 is divided in multiple segments 29A–29D corresponding to the multiple beams of charged particles 4A–4D (see FIG. 13). Thereby, each segment 29A–29D of the detector is capable of detecting particles that come from the specimen 8 independent of all the other segments of the detector 29. Furthermore, detector 29 comprises multiple openings to let the beams of charged particles 4A–4D pass through.

Figure 12:
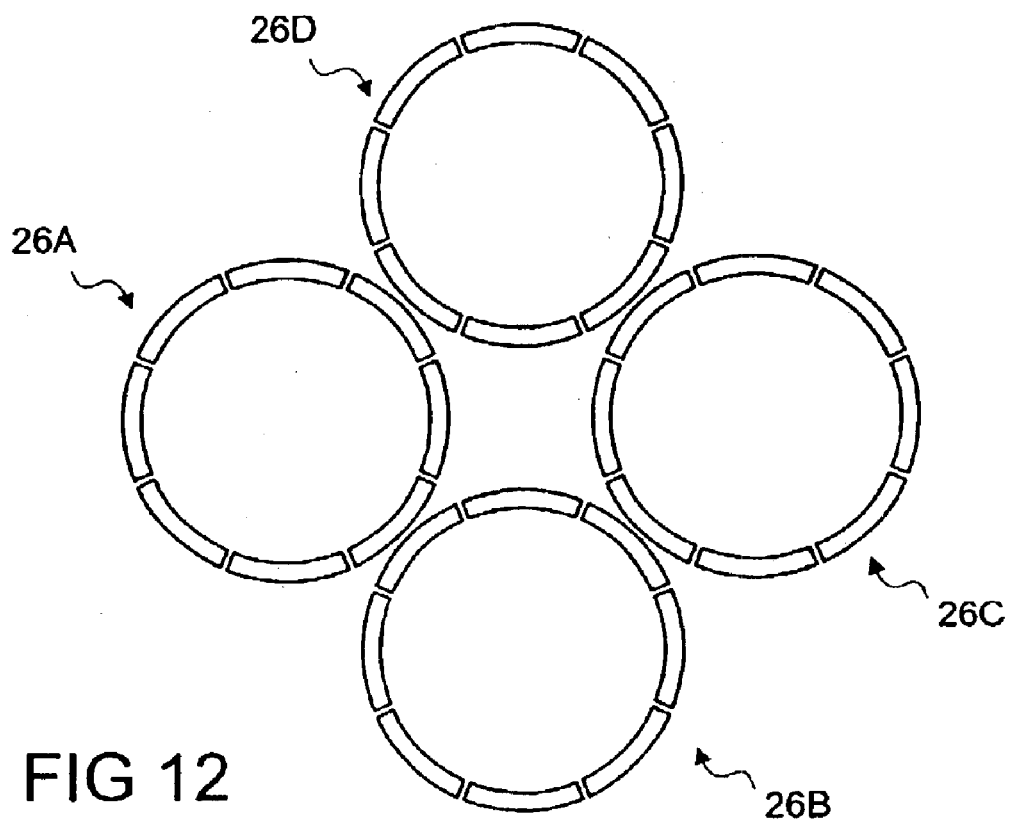
FIG. 12 shows schematically a top view on the deflectors as used in the column shown in FIG. 10.

FIG. 12 shows schematically a top view on the deflectors 26A–26D as used in the column shown in FIG. 10. Thereby, each deflector 26A–26D comprises eight electrodes. Each deflector 26A–26D generates static deflecting fields for correction of the beam paths through the objective lens and for positioning the beams at the specimen. Furthermore, the deflectors 26A–26D can be used for compensation of the aberrations arising from a deviation of the objective lens from the axial symmetry.

Figure 14:
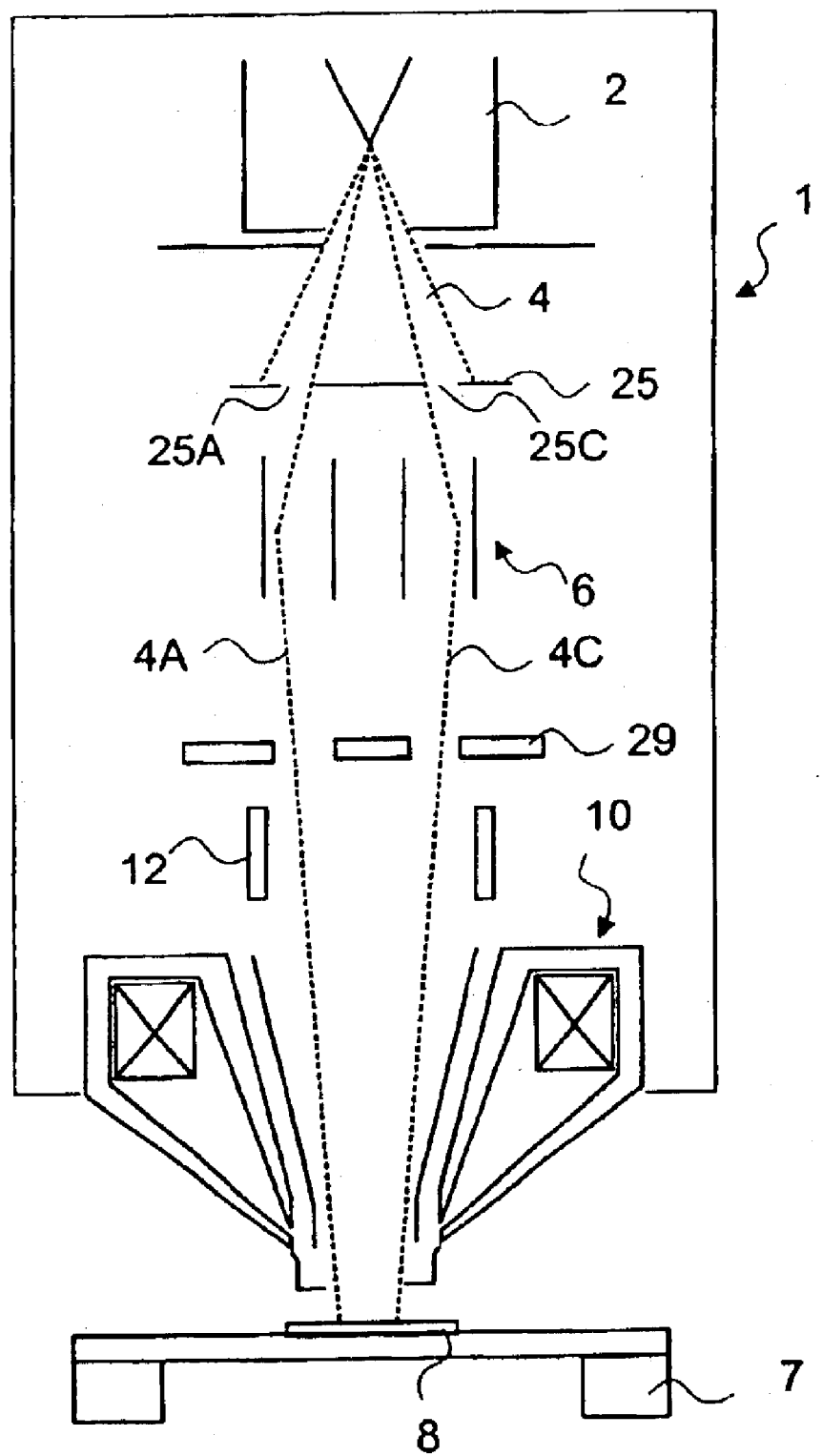
FIG. 14 shows schematically a column according to a fourth embodiment according to the present invention.

FIG. 14 shows schematically a column according to a third embodiment of the present invention. This embodiment is also similar to that of FIG. 1, except for the following; After leaving the charged particle source 2 the charged particle beam 4 passes through the aperture plate 25 having four apertures 25A–25D which are situated at equal distance along a ring on the aperture plate 25. By passing through the aperture plate 25, four charged particle beams 4A–4D are created. Thereafter, the deflector 6 is used to influence the beams of charged particles 4A–4D so that each beam 4A–4D appears to come from a different source. Furthermore, the deflector 6 is used to influence the beams of charged particles 4A–4D so that each beam 4A–4D traverses the objective lens 10 along an off-axis path. Due to the off-axis path of the charged particle beams 4A–4D, the beams are tilted and hit the specimen under oblique angles of incidence.

Figure 15:
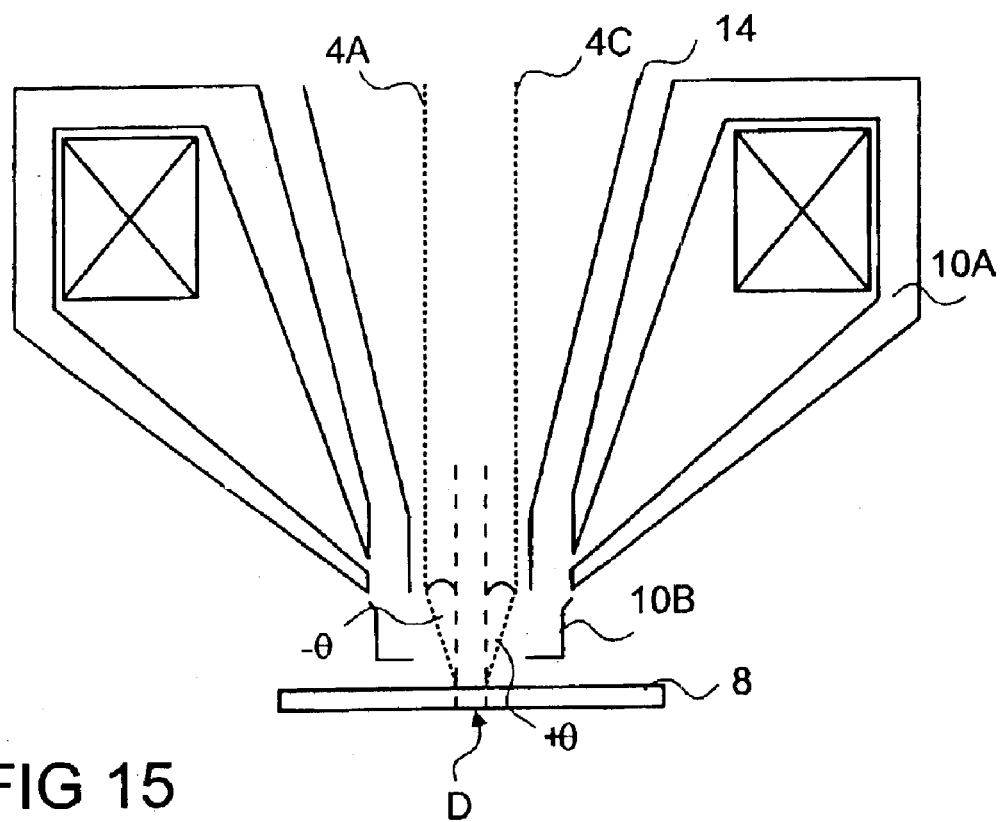
FIG. 15 is an enlarged view showing the objective lens of the embodiment of FIG. 14.

FIG. 15 shows an enlarged view on the compound magnetic-electrostatic lens 10 and the specimen 8 as shown in FIG. 14. Thereby, the beam 4A hits the specimen 8 under an oblique angle of incidence $-\theta$, as measured with regard to an axis normal to the surface of the specimen. Furthermore, the beam 4C hits the specimen 8 under an oblique angle of incidence $+\theta$. The electron beams 4A and 4C do not hit the specimen at the same spot but are displaced from each other by a distance D. By scanning the two beams 4A and 4C over the surface of the specimen the images from the two beams 4A and 4C are recorded. Based on the fact that beams hit the specimen under different angles of incidence, the images of the two beams are sufficient to produce a stereoscopic image of the surface of specimen.

As outlined with regard to FIG. 1, the electrostatic retarding lens 10B has two electrodes held at different potentials. In the illustrated embodiment, one of the two electrodes is formed by a cylindrical beam tube 14 which is arranged within the magnetic lens 10A along the optical axis. The second electrode of the electrostatic retarding lens 10B is a metallic cup provided below the magnetic lens 10A. In operation of the system, the first electrode is usually held at high positive potential, for example 8 kV, where as the second electrode is held at lower positive potential, for example 3 kV, so that the electrons are decelerated in the corresponding electrostatic field from a first energy to a lower second energy.

In the example shown in FIG. 15, the specimen 8 is held at ground potential. Accordingly, there is a further electrostatic retarding field between the metallic cup and the specimen 8. Due to the electrostatic retarding field between the metallic cup and the specimen 8, the initial tilt of the charged particle beams 4A–4D caused by the off-axis path of the charged particle beams 4A–4D is enhanced leading to increased angles of incidence. The surface of the specimen need not be grounded. The electric potential on the surface of the specimen may also be adjusted by applying a voltage to the specimen. A voltage can be applied to a wafer, for example, in order to obtain voltage contrast imaging which is used to detect shorts in a circuit. As long as the potential of the metallic cup is higher than the potential on the surface of the specimen 8, an electrostatic retarding field is produced.

By scanning the four beams 4A–4D over the surface of the specimen, stereoscopic images of the surface can be made in a single scan. Accordingly, stereoscopic images of a specimen can be produced in a fast and reliable manner without the need for any additional alignments. Therefore, the additional information, which is contained in stereo images and which is extremely helpful in many cases, can be accessed without causing any additional costs and without causing any additional time delays.

The embodiment shown in FIG. 14 uses the off-axis path of the beams through the objective lens 10 in order to tilt the beams 4A–4D. However, the off-axis path of the beams through the objective lens 10 gives rise to chromatic aberrations. The charged particles, usually electron, in the beams are not monochromatic, but are emitted with slightly different energies. For example, in a thermionic electron gun, the energy spread (i.e., the full width at half maximum of the electron energy distribution) is on the order of $\Delta E=2.5\ kT_c$, where $T_c$ is the temperature of the cathode tip and k is Boltzmann's constant. This energy spread is further increased by the Boersch effect arising from space-charge oscillations near a crossover, so that thermionic tungsten cathodes show an energy spread of $\Delta E=1-3$ eV, while for $LaB_6$ cathodes the value is $\Delta E=0.5-2$ eV. Field emission guns usually have a lower energy spread due to the smaller cathode temperatures of the order of $\Delta E=0.2-0.4$ eV (L. Reimer, Scanning Electron Microscopy, Springer, 1985).

Figure 16:
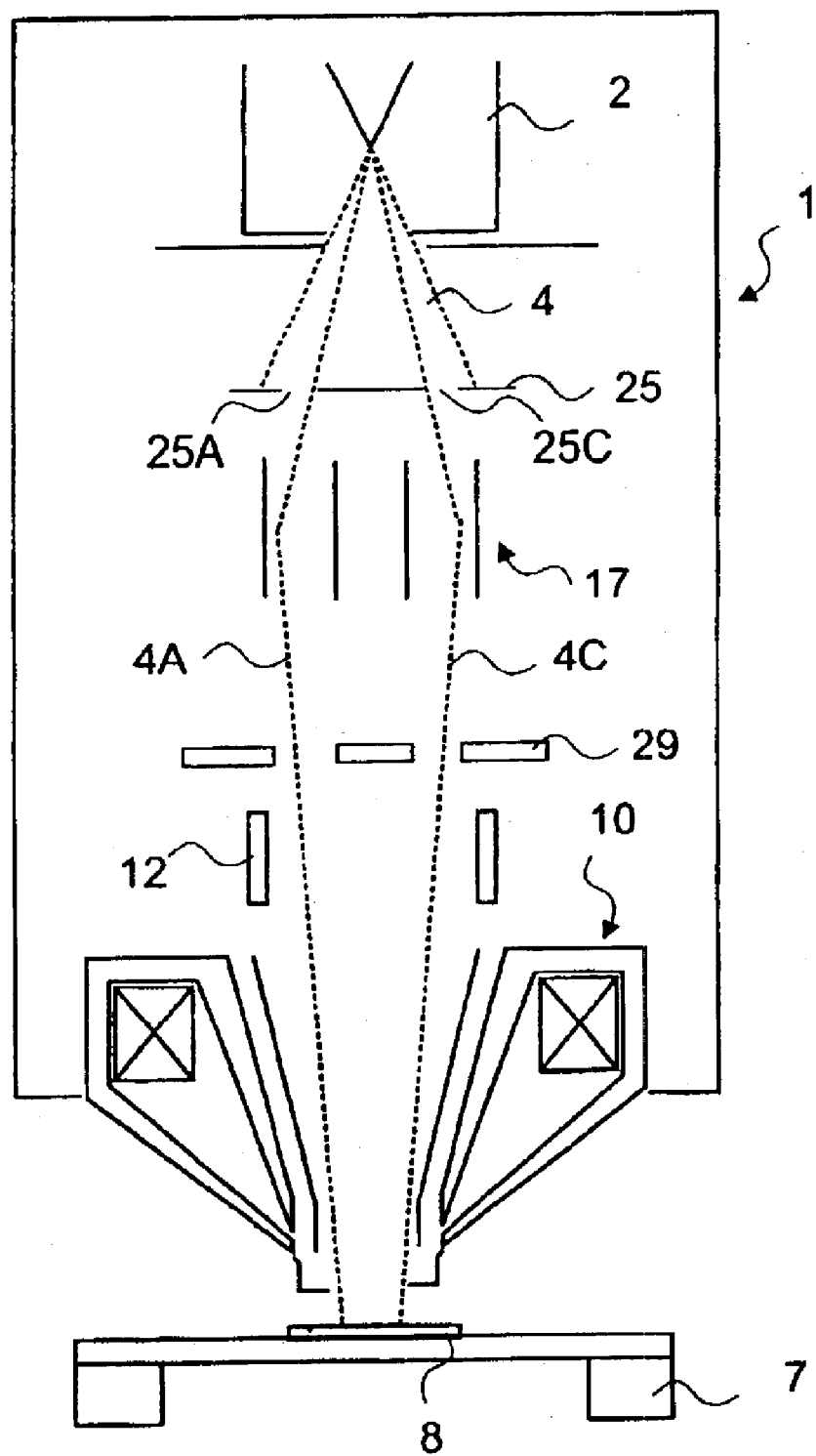
FIG. 16 shows schematically a column according to a fifth embodiment according to the present invention.

In order to decrease the chromatic aberrations, FIG. 16 shows a schematic diagram of an apparatus according to a further embodiment of the present invention. This embodiment is similar to that of FIG. 10, except for the following. The deflector 6 has been replaced by an integrated unit 17 comprising a deflector 17A and a coil arrangement 17B (see FIG. 17). The deflector 17A and the coil arrangement 17B generate crossed electrostatic and magnetic deflection fields which disperse the beams 4A–4D of charged particles. By dispersing the beams of charged particles a second chromatic aberration of substantially the same kind and magnitude but opposite direction as the chromatic aberration caused off-axis path of the beams through the objective lens can be produced. Accordingly, the chromatic aberration caused by the off-axis path can be compensated in the plane of the specimen surface.

Figure 17:
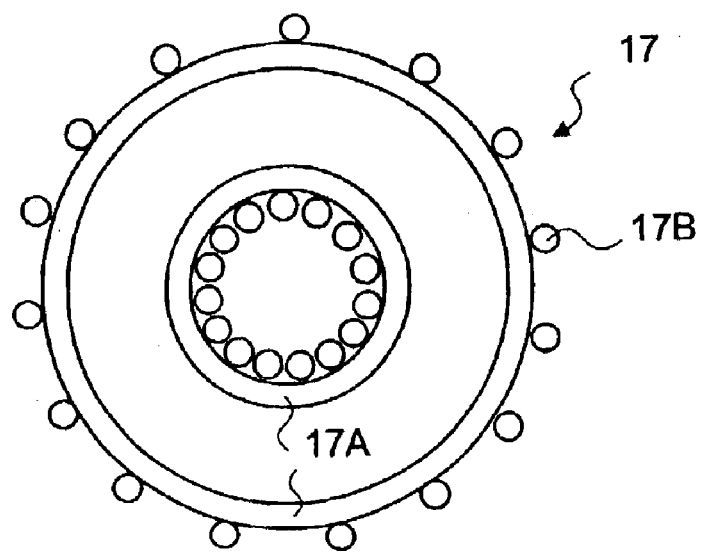
FIG. 17 shows schematically a top view on the compensation unit as used in the column shown in FIG. 16.

FIG. 17 shows schematically a top view on the unit 17 as used in the column shown in FIG. 16. The unit 17 comprises a deflector 17A having the form of a cylinder lens. The cylinder deflector 17A comprises two cylinder electrodes which are set to appropriate potentials. In order to attract the charged particle beams 4A–4D towards the inner cylinder electrode, a potential difference between the inner cylinder electrode and the outer cylinder electrode is provided. Thereby, the potential difference between the inner cylinder electrode and the outer cylinder electrode is chosen in such a manner that the beam pass through the objective lens along an off-axis path and hits the specimen under oblique angles of incidence. The appropriate potential difference between the inner cylinder electrode 6A and the outer cylinder electrode 6B depends on a number different parameters; for example, the energy of the charged particles inside the deflector 6, the desired distance between two adjacent beams on the surface of the specimen, and the angles of incidence on the surface of the specimen. Usually, the potential difference lies in the range of 100 to 500 Volts.

In addition to the cylinder deflector 17A, the unit 17 comprises a coil arrangement 17B which is used to generate a magnetic field within cylinder deflector 17A. Thereby, the magnetic field is essentially perpendicular to the electric filed generated by the inner cylinder electrode and the outer cylinder electrode. The integrated unit 17 acts like a Wien filter, in which the electric field E and the magnetic field B generate an electric and a magnetic force on the charged particles, $F_{el}=qE$, and $F_{mag}=q(v\times B)$, wherein $q=-e$ is the electron charge. If the electric and magnetic field are perpendicular to each other and to the velocity of the charged particle, the electric and magnetic forces are in opposite directions. For particles with a certain velocity, $v=|E|/|B|$, the net force is zero, and they pass the filter unaffected. Particles with a different speed experience a net force $F=|F_{el}-F_{mag}|$ and are deflected by the unit 17. In effect, the beams of charged particles with a finite energy spread passing the unit 17 are dispersed, as particles with different energies are deflected by different amounts.

The dispersion leads to an at least partial compensation of the chromatic aberration caused by the off-axis pass through the objective lens. The embodiment shown in FIG. 16 has thus the advantage that large angles of incidence on the sample surface can be provided without reduction in resolution arising from large chromatic aberrations.

Figure 18:
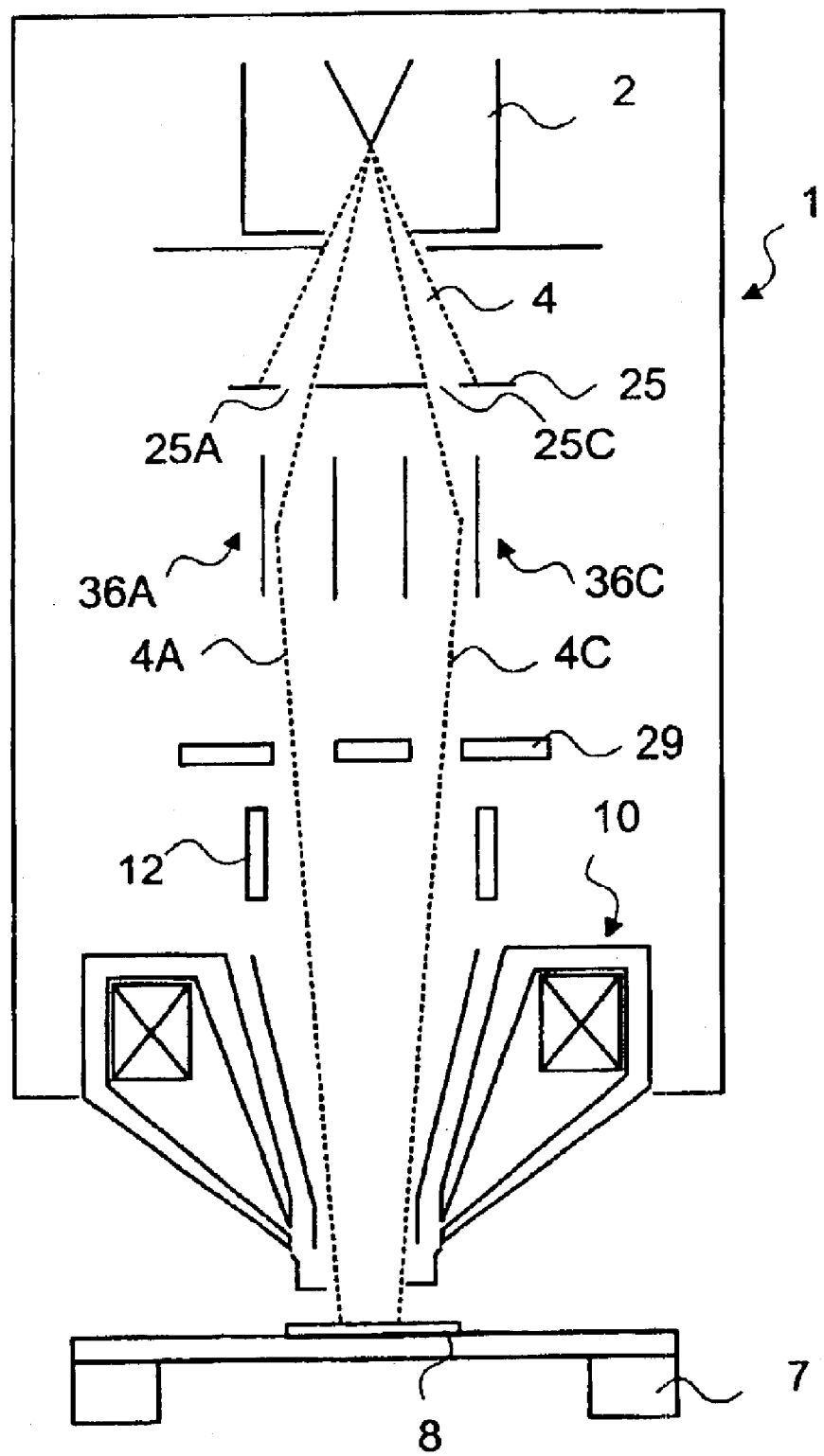
FIG. 18 shows schematically a column according to a further embodiment according to the present invention.
Figure 19:
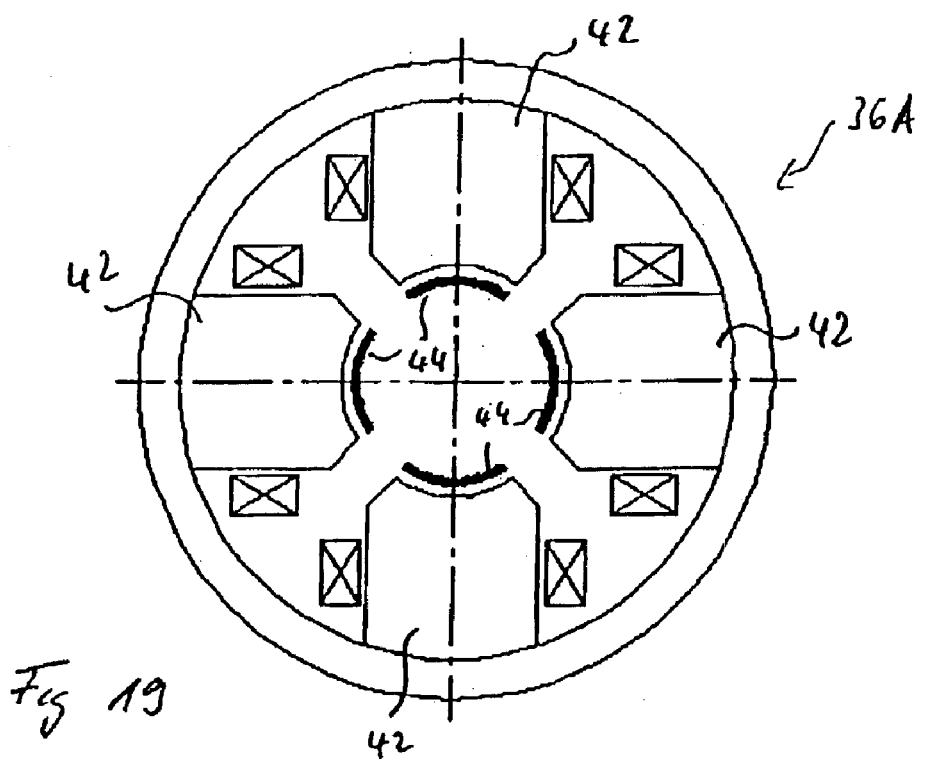
FIGS. 19, 20 show schematically a top view and a side view on the compensation unit as used in the column shown in FIG. 18.
Figure 20:
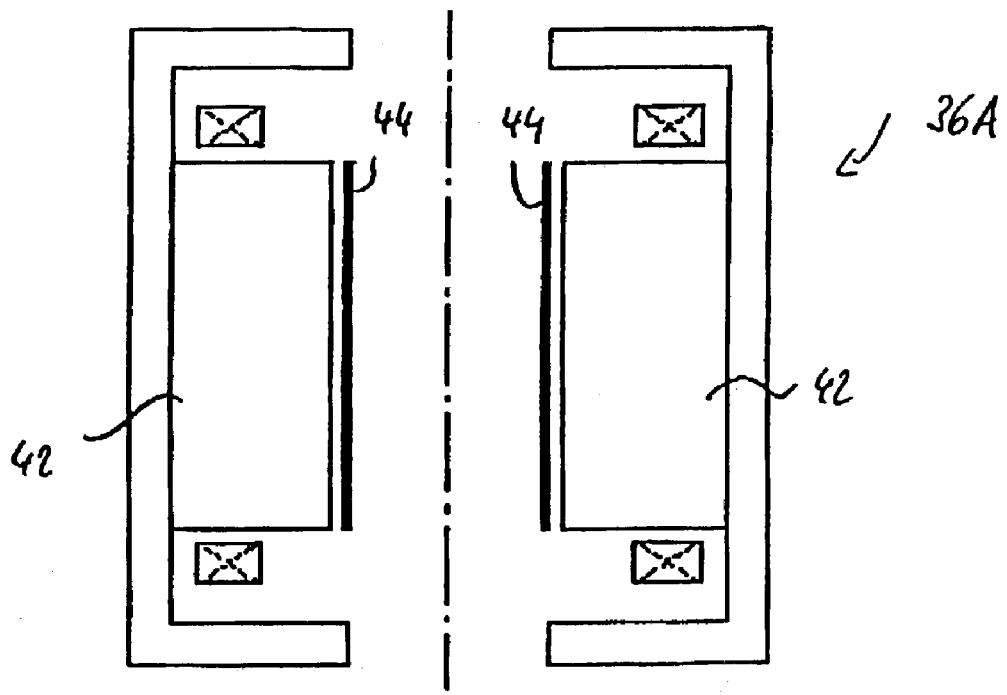

FIG. 18 shows schematically a column according to a still further embodiment according to the present invention. This embodiment is similar to that of FIG. 16, except for the following; After passing through the aperture plate 25 four charged particle beams 4A–4D enter the compensation units 36A–36D. The compensation units 36A–36D are again used to influence the beams of charged particles 4A–4D so that each beam 4A–4D appears to come from a different source. Furthermore, the compensation units 36A–36D are used to influence the beams of charged particles 4A–4D so that each beam 4A–4D traverses the objective lens 10 along an off-axis path. The compensation units 36A–36D influence each of the beams 4A–4D individually which leads to a better control of the properties of each individual beam FIGS. 19 and 20 show the compensation unit 36A used in FIG. 18. The compensation unit 36A forms a Wien filter having an electrostatic and magnetic quadrupole (4-pole). The quadrupole comprises four pole pieces 42 and four electrodes 44. The electrodes and pole pieces are arranged in a plane perpendicular to the path of the charged particles. As best shown in FIG. 19, the electrodes and the pole pieces are each placed along the circumference of a circle, spaced by an angle of $\pi/2$. Since the pole pieces and the corresponding electrodes have the same length (FIG. 20) and almost the same radius (FIG. 19), the resulting electric and magnetic field distributions are very similar leading to a good compensation of the electric and magnetic forces for the electrons with predetermined energy in any point along the optical axis of the Wien filter.

Using such a quadrupole arrangement, magnetic and electrostatic fields can be adjusted to deflect in an arbitrary direction in the plane perpendicular to the optical axis. Thereby, a compensation can be achieved for any direction of the deflecting action.

What is claimed is:

1. A column for a charged particle beam device, which is used to examine and/or modify a specimen, said column comprising:
   a) a source of charged-particles,
   b) an aperture plate having at least two apertures to produce at least two beams of charged particles,
   c) at least one deflector to influence the beams of charged particles so that each beam appears to come from a different source,
   d) at least one detector for measuring secondary particles and/or backscattered particles coming from the specimen, and
   e) an objective lens for focusing the charged-particle beams onto the specimen.

2. The column according to claim 1, wherein said deflector comprises concentric cylinder electrodes.

3. The column according to claim 1, wherein a deflector is provided for each individual beam.

4. The column according to claim 3, wherein the deflectors are electrostatic multipoles, preferably selected from the group consisting of electrostatic dipole, quadrupole, hexapole and octupole.

5. The column according to any of preceding claims, wherein the detector is positioned before the objective lens and comprises multiple openings to let the beams of charged particles pass through.

6. The column according to any of preceding claims, wherein the detector is subdivided into multiple segments corresponding to the multiple beams of charged particles.

7. The column according to any of preceding claims, wherein the objective lens is adapted to focus the secondary particles and/or backscattered particles onto the detector.

8. The column according to any of preceding claims, wherein said objective lens comprises a magnetic lens and an electrostatic lens.

9. The column according to claim 8, wherein a first electrode and means for applying a first potential to said first electrode are provided and wherein a second electrode and means for applying a second potential to said second electrode are provided to generate an electrical field in said electrostatic lens so that the particle beams in said electrical field are decelerated from a first energy to a second lower energy.

10. The column according to any of preceding claims, wherein said apertures in said aperture plate are arranged along at least one ring.

11. The column according to any of preceding claims, wherein the column comprises a beam selector for selecting the number of charged particle beams used to examine the specimen.

12. A column for a charged particle beam device, which is used to examine a specimen, said column comprising:
   a) a source of charged-particles,
   b) an aperture plate having at least two apertures to produce at least two beams of charged particles,
   c) an objective lens for focusing the charged-particle beams onto the specimen,
   d) at least one deflector to influence the beams of charged particles so that each beam appears to come from a different source and so that by the combined action of the deflector and the objective lens the beams are tilted and hit the specimen with predetermined angles of incidence, and
   e) at least one detector for measuring secondary particles and/or back-scattered particles coming from the specimen.

13. The column according to claim 12, wherein said deflector comprises concentric cylinder electrodes.

14. The column according to claim 12, wherein a deflector is provided for each individual beam.

15. The column according to claim 14, wherein the deflectors are electrostatic multipoles, preferably selected from the group consisting of electrostatic dipole, quadrupole, hexapole and octupole.

16. The column according to one of claims 12 to 15, wherein the detector is positioned before the objective lens and comprises multiple openings to let the beams of charged particles pass through.

17. The column according to one of claims 12 to 16, wherein the detector is subdivided into multiple segments corresponding to the multiple beams of charged particles.

18. The column according to one of claims 12 to 17, wherein the objective lens is adapted to focus the secondary particles and/or backscattered particles onto the detector.

19. The column according to one of claims 12 to 18, wherein said objective lens comprises a magnetic lens and an electrostatic lens.

20. The column according to claim 19, wherein a first electrode and means for applying a first potential to said first electrode are provided and wherein a second electrode and means for applying a second potential to said second electrode are provided to generate an electrical field in said electrostatic lens so that the particle beams in said electrical field are decelerated from a first energy to a second lower energy.

21. The column according to one of claims 12 to 20, wherein said apertures in said aperture plate are arranged along at least one ring.

22. The column according to one of claims 12 to 21, wherein the column comprises a beam selector for selecting the number of charged particle beams used to examine the specimen.

23. The column according to one of claims 12 to 22, wherein the column comprises a least one compensation unit adapted to disperse the beams of charged particles, thereby substantially compensating chromatic aberration in the plane of the specimen surface.

24. The column according to claim 23, wherein the compensation unit comprises means for generating crossed electrostatic and magnetic deflection fields.

25. The column according to one of claim 23 or 24, wherein the compensation unit and the deflector are integrated into one unit.

26. The column according to claim 25, wherein the compensation unit comprises concentric cylinder electrodes and a coil arrangement.

27. The column according to claim 25, wherein the compensation unit is an electrostatic and magnetic multipole, preferably selected from the group consisting of electrostatic and magnetic dipole, quadrupole, hexapole and octupole.

28. The column according to one of claims 12 to 27, wherein the column is adapted to provide angles of incidence between 2° and 15°, preferable between 3° and 10°.

* * * * *